United States Patent
Heo et al.

(10) Patent No.: US 8,168,981 B2
(45) Date of Patent: May 1, 2012

(54) DISPLAY SUBSTRATE HAVING STEPPED DATA LINE AND A LIQUID CRYSTAL DISPLAY DEVICE HAVING THE SAME

(75) Inventors: Seong-Kweon Heo, Suwon-si (KR); Chun-Gi You, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 12/346,969

(22) Filed: Dec. 31, 2008

(65) Prior Publication Data

US 2009/0261340 A1     Oct. 22, 2009

(51) Int. Cl.
*H01L 29/04*      (2006.01)
*H01L 31/036*     (2006.01)

(52) U.S. Cl. .................. 257/72; 257/59; 349/41

(58) Field of Classification Search .......... 257/59, 257/72; 349/41
See application file for complete search history.

(56) References Cited

U.S. PATENT DOCUMENTS

| | | | |
|---|---|---|---|
| 5,414,547 A * | 5/1995 | Matsuo et al. | 349/44 |
| 7,184,113 B2 * | 2/2007 | Baek | 349/114 |
| 7,294,855 B2 * | 11/2007 | Baek et al. | 257/72 |
| 2004/0246409 A1 | 12/2004 | Jeon et al. | |
| 2006/0001814 A1 | 1/2006 | Paik et al. | |
| 2007/0182875 A1 | 8/2007 | Kim et al. | |

FOREIGN PATENT DOCUMENTS

| KR | 1020050006625 A | 1/2005 |
|---|---|---|
| KR | 1020050103684 A | 11/2005 |
| KR | 1020060064811 A | 6/2006 |
| KR | 1020070008882 A | 1/2007 |

* cited by examiner

*Primary Examiner* — Howard Weiss
(74) *Attorney, Agent, or Firm* — Cantor Colburn LLP

(57) ABSTRACT

A display substrate includes; a gate line disposed on a substrate, a first insulating layer disposed on the substrate including the gate line, the first insulating layer including an opening part extended in a direction crossing the gate line, a data line disposed on the first insulating layer and an inner surface of the opening part, the data line extending in a direction substantially parallel with an extension direction of the opening part, a protective layer disposed on the first insulating layer and the data line, a switching element electrically connected to the gate line and the data line and a pixel electrode electrically connected to the switching element.

18 Claims, 15 Drawing Sheets

114

DISPLAY SUBSTRATE HAVING STEPPED DATA LINE AND A LIQUID CRYSTAL DISPLAY DEVICE HAVING THE SAME

This application claims priority to Korean Patent Application No. 2008-36008, filed on Apr. 18, 2008, and all the benefits accruing therefrom under 35 U.S.C. §119, the contents of which in its entirety are herein incorporated by reference.

BACKGROUND OF THE INVENTION

1. Field of the Invention

Exemplary embodiments of the present invention relate to a display substrate, a liquid crystal display ("LCD") device having the display substrate and a method of manufacturing an array substrate. More particularly, exemplary embodiments of the present invention relate to a display substrate for a display device having improved image quality, an LCD device having the display substrate and a method of manufacturing an array substrate.

2. Description of the Related Art

A liquid crystal display ("LCD") device displays an image using liquid crystal cells that are arranged on an LCD panel as a matrix shape. The liquid crystal cells change light transmittance based on image signals.

An on/off signal is applied to a thin-film transistor ("TFT") through a gate line, and a signal is applied to a source electrode of the TFT to form a voltage difference between a pixel electrode of an array substrate and a common electrode of an opposite substrate. Thus, the LCD device displays the image. The LCD device displays the image using light generated from a backlight assembly, and includes a black matrix to prevent color mixture on a boundary between adjacent pixels displaying different colors. However, the black matrix decreases the aperture ratio of the LCD device. When the aperture ratio of the LCD device is decreased, a high intensity of the light generated from the backlight assembly is required to increase the luminance of the LCD device. When the intensity of the light generated from the backlight assembly is increased, the power consumption of the backlight assembly may be increased.

BRIEF SUMMARY OF THE INVENTION

Exemplary embodiments of the present invention provide a display substrate capable of increasing an aperture ratio and decreasing a parasitic capacitance between a data line and a pixel electrode. Exemplary embodiments of the present invention also provide a liquid crystal display ("LCD") device having the display device. Exemplary embodiments of the present invention also provide a method of manufacturing an array substrate including the display device.

According to one exemplary embodiment of the present invention, a display substrate includes; a gate line disposed on a substrate, a first insulating layer disposed on the substrate including the gate line, the first insulating layer having an opening part extended in a direction crossing the gate line, a data line disposed on the first insulating layer and an inner surface of the opening part, the data line extending in a direction substantially parallel with an extension direction of the opening part, a protective layer disposed on the first insulating layer and the data line, a switching element electrically connected to the gate line and the data line, and a pixel electrode electrically connected to the switching element.

In one exemplary embodiment, the data line may have a stepped structure.

In one exemplary embodiment, the stepped structure may be formed on the opening part.

In one exemplary embodiment, the opening part may be overlapped by the pixel electrode.

In one exemplary embodiment, the protective layer may include an organic insulating layer.

In one exemplary embodiment, the data line may be overlapped by the pixel electrode.

In one exemplary embodiment, the display substrate may further include a second insulating layer interposed between the substrate and the first insulating layer.

In one exemplary embodiment, a side surface of the opening part may be formed through the first and second insulating layers.

In one exemplary embodiment, the second insulating layer may include a gate insulating layer.

In one exemplary embodiment, the data line may contact the substrate, the first insulating layer and the second insulating layer disposed in the opening part.

In one exemplary embodiment, the display substrate may further include a blocking layer interposed between the substrate and the second insulating layer.

According to another exemplary embodiment of the present invention, a liquid crystal display device includes; a first display substrate including a first substrate, a black matrix disposed on the first substrate and a common electrode disposed on the first substrate including the black matrix, a second display substrate including; a gate line disposed on a substrate, a first insulating layer disposed on the substrate including the gate line, the first insulating layer having an opening part extended in a direction crossing the gate line, a data line disposed on the first insulating layer and an inner surface of the opening part, the data line extending in a direction substantially parallel with an extension direction of the opening part, a protective layer disposed on the first insulating layer and the data line, a switching element electrically connected to the gate line and the data line, and a pixel electrode electrically connected to the switching element and a liquid crystal layer interposed between the first and second display substrates.

In one exemplary embodiment, the black matrix may correspond to the opening part.

In one exemplary embodiment, the data line may have a stepped structure disposed in the opening part.

In one exemplary embodiment, the liquid crystal display device may further include a second insulating layer interposed between the second substrate and the first insulating layer.

In one exemplary embodiment, the data line may be overlapped by the pixel electrode.

In one exemplary embodiment, the width of the data line disposed in the opening part may be substantially the same as the width of the black matrix or greater than the width of the black matrix by up to about 20%.

In one exemplary embodiment, the protective layer may include an organic insulating layer.

According to another exemplary embodiment of the present invention, a method of manufacturing an array substrate includes disposing a gate line on a substrate, covering the gate line with a first insulating layer, partially removing the first insulating layer to form an opening part extended in a direction crossing the gate line, disposing a data line on the first insulating layer and an inner surface of the opening part, the data line extending in a direction substantially parallel with an extension direction of the opening part, and disposing a protective layer on the first insulating layer and the data line. The opening part may be disposed substantially perpendicular to the gate line.

In one exemplary embodiment, the method of manufacturing the array substrate may further include disposing a semiconductor layer on the substrate, disposing a first electrode and a second electrode on the first insulating layer, wherein the second electrode is spaced apart from the first electrode, the first electrode being electrically connected to the data line, and disposing a pixel electrode on the protective layer, the pixel electrode partially overlapping the data line and electrically connecting the second electrode.

According to additional exemplary embodiments of the present invention, a black matrix may be omitted, and an opening of a pixel region may be formed by only the data lines. Thus, a parasitic capacitance between the pixel electrode and the data lines may be minimized, and leakage of light may be decreased. Also, an aperture ratio may be increased.

BRIEF DESCRIPTION OF THE DRAWINGS

The above and other features and advantages of the present invention will become more apparent by describing in detailed example embodiments thereof with reference to the accompanying drawings.

DETAILED DESCRIPTION OF THE INVENTION

Figure 1:
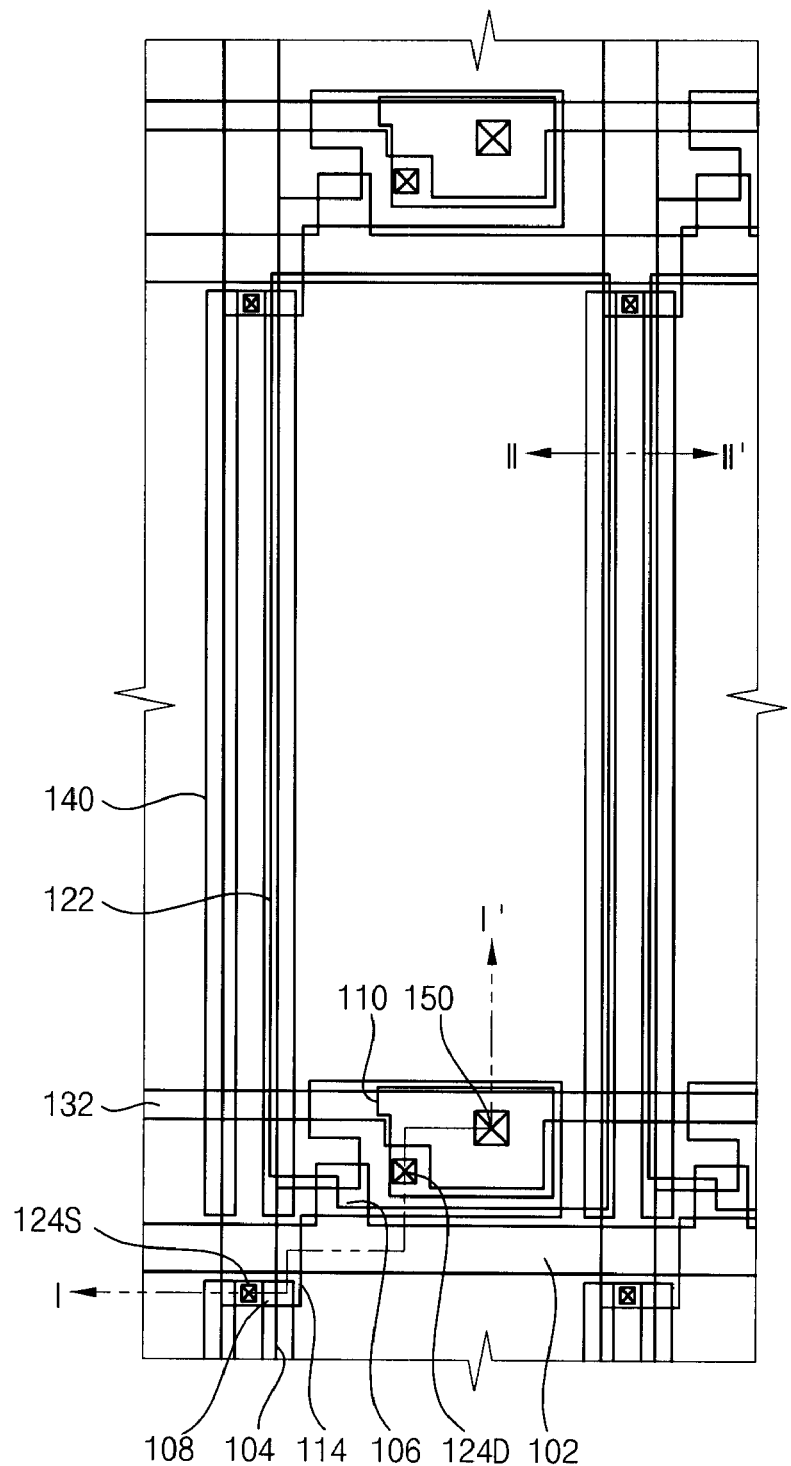
FIG. 1 is a top plan layout view illustrating a display substrate in accordance with one embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
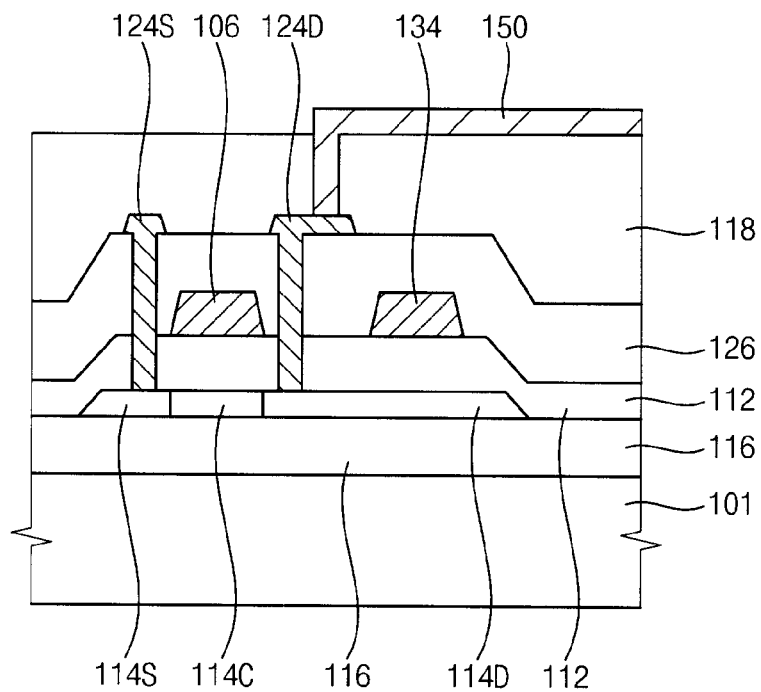
FIG. 2 is a cross-sectional view taken along line I-I' of FIG. 1.
Figure 3:
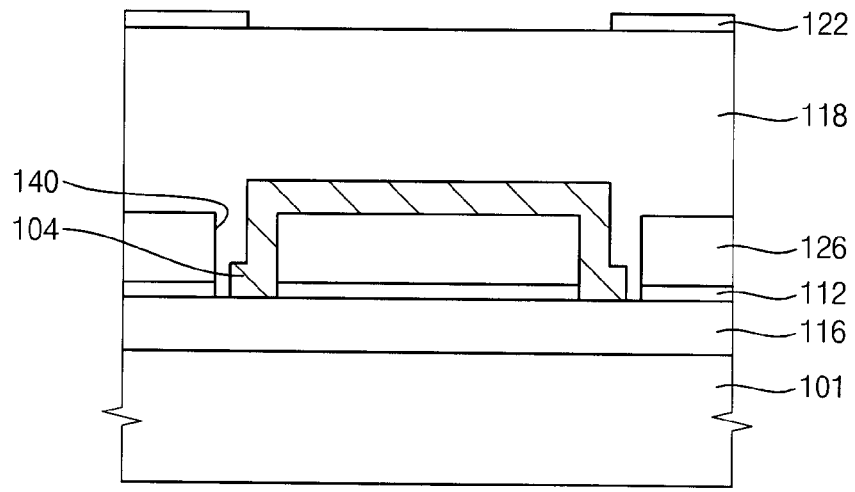
FIG. 3 is a cross-sectional view taken along line II-II' of FIG. 1.

FIG. 1 is a top plan layout view illustrating an exemplary embodiment of a display substrate in accordance with the present invention. FIG. 2 is a cross-sectional view taken along line I-I' of FIG. 1. FIG. 3 is a cross-sectional view taken along line II-II' of FIG. 1.

Referring to FIGS. 1 and 2, the display substrate includes a lower substrate 101, a thin-film transistor ("TFT") electrically connected to a gate line 102 and a data line 104 on the lower substrate 101, and a pixel electrode 122 disposed in a pixel region defined on the lower substrate 101. In the exemplary embodiment shown in FIGS. 1 and 2, the TFT includes an n-type transistor. Alternative exemplary embodiments include configurations wherein the TFT may include a p-type transistor.

The TFT controls an application of an image signal from the data line 104 to the pixel electrode 122 based on a scan signal transmitted through the gate line 102. The TFT includes a gate electrode 106 electrically connected to the gate line 102, a source electrode 108 electrically connected to the data line 104, a drain electrode 110 electrically connected to the pixel electrode, and an active layer 114 disposed in a channel between the source electrode 108 and the drain electrode 110 corresponding to the gate electrode 106.

The gate electrode 106, which is electrically connected to the gate line 102, is overlapped with a channel region 114c of the active layer 114, and a gate insulating layer 112 is interposed between the gate electrode 106 and the active layer 114. The source electrode 108 and the drain electrode 110 are insulated from the gate electrode 106 by an insulating interlayer 126. The source electrode 108 is electrically connected to a source region 114S of the active layer 114, into which n+ impurities are implanted, through a source contact hole 124S. The drain electrode 110 is electrically connected to a drain region 114D of the active layer 114, into which the n+ impurities are implanted, through a drain contact hole 124D. In one exemplary embodiment, the active layer 114 may be formed on the lower substrate 101, and may include the channel region 114C, the source region 114S and the drain region 114D. In an alternative exemplary embodiment, the active layer 114 may further include a lightly doped drain ("LDD") region (not shown) into which n− impurities are implanted between the source and drain regions 114S and 114D to decrease an off current.

A storage line 132, which crosses the pixel electrode 122, overlaps the active layer 114D and functions as a storage electrode and the gate insulating layer 112 is interposed between the storage line 132 and the active layer 114D to form a storage capacitor Cst. In one exemplary embodiment, the storage line 132 may be formed from the same layer as the gate line 102, and may include substantially the same material composition.

As shown in FIG. 3, the exemplary embodiment of a display substrate includes the gate insulating layer 112, the insulating interlayer 126, an opening part 140, the data line 104, a protective layer 118 formed on the data line 104, and the pixel electrode 122.

The opening part 140 is simultaneously formed with the source and drain contact holes 124S and 124D, respectively, and is extended in a direction substantially parallel with the data line 104. The opening part 140 is partially overlapped by an adjacent region of the pixel electrode 122. The opening part 140 may not be overlapped with the gate line 102 so that the opening part 140 does not cross a stepped portion formed by the gate line 102. In an alternative exemplary embodiment, the opening part 140 may be extended to cross the gate line 102. In one exemplary embodiment, the opening part 140 may only be formed on a region adjacent to a side of the pixel electrode 122. In one exemplary embodiment, the opening part 140 may be formed through subsequent etching processes for etching the insulating interlayer 126 and the gate insulating layer 112.

The data line 104 is formed in the opening part 140. The data line 104 may be spaced apart from side surfaces of the gate insulating layer 112 and the insulating interlayer 126 that are overlapped by the pixel electrode 122, so that the side of the data line 104 may be disposed in the opening part 140 even if a misalignment of the data line 104 and the opening part 140 occurs. When the opening part 140 is formed adjacent to the side of the pixel electrode 122, the data line 104 has a stepped structure and makes contact with sides of the gate insulating layer 112 and the insulating interlayer 126, which are not overlapped with the pixel electrode 122. In an alternative exemplary embodiment, the side surfaces of the opening part 140 may be inclined with respect to the surface of the lower substrate, so that the data line 104 may have a trapezoidal cross-section. In one exemplary embodiment, the pixel electrode 122 may be overlapped with the data line 104 formed under the protective layer 118.

The protective layer 118 is formed on the insulating interlayer 126 and the data line 104. In one exemplary embodiment, the protective layer 118 may include an organic layer to increase the surface uniformity of the substrate.

As shown in FIG. 2, a blocking layer 116 may be formed between the lower substrate 101 and the active layer 114. The blocking layer 116 blocks impurities from flowing into the lower substrate 101, and temporarily stores heat generated, e.g., heat generated by a laser beam, to increase crystal sizes of polysilicon formed thereon. Exemplary embodiments of the blocking layer 116 may include silicon nitride, silicon oxide, combinations thereof, and various other materials with similar characteristics.

In another exemplary embodiment, the data line may be overlapped with the pixel electrode to prevent leakage of light generated from a backlight assembly introducing light into the display apparatus. However, when the data line is adjacent to the pixel electrode along the side of the pixel region, a parasitic capacitance between the data line and the pixel electrode may deteriorate image display quality. Thus, in a comparative display a light-blocking layer may be formed under the data line from substantially the same metal layer as the gate line to decrease the leakage of light from the backlight assembly through the display, and the data line may therefore be spaced apart from the pixel electrode to prevent the development of parasitic capacitance. However, when the light-blocking layer is formed using the same metal layer as the gate line, and the light-blocking layer is disposed under the data line, the width of the light-blocking layer is increased to prevent the leakage of the light. Thus, an aperture ratio may be decreased and the power consumption of the backlight assembly may be increased.

However, in FIGS. 1 to 3, the light-blocking layer is omitted, and the data line 104 is formed along the opening 140 that is formed on the side of the pixel region. Therefore, the portion of the data line 104 closest to the pixel electrode 22 along the side of the pixel region is disposed at a lower height than the rest of the data line 104, therefore increasing the separation between the data line 104 and the pixel electrode 22, while still blocking light from leaking therethrough. Thus, the leakage of the light may be prevented and the parasitic capacitance may be minimized. Also, the opening part 140 may be simultaneously formed with the contact holes 124S and 124D using one mask, so that an additional process for forming the opening part 140 may be omitted.

Figure 4:
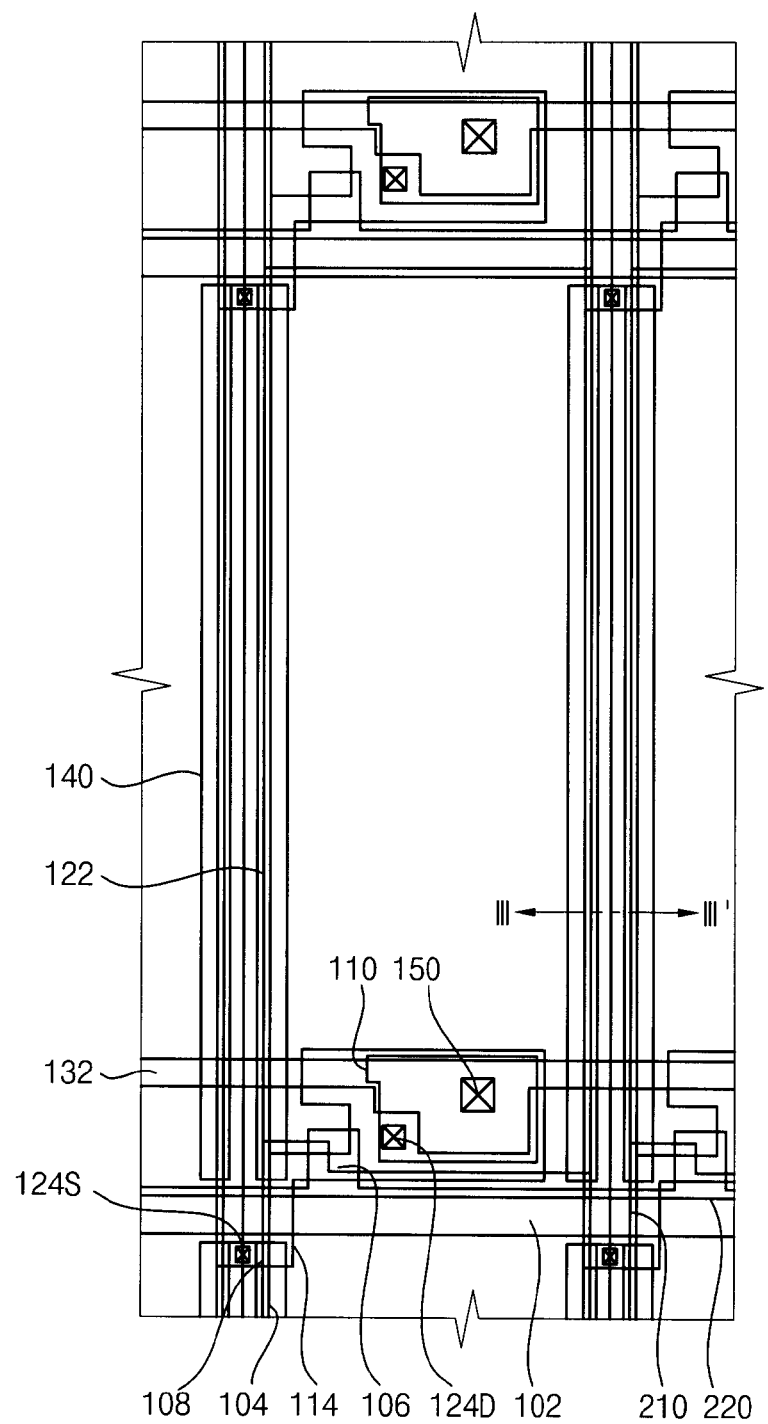
FIG. 4 is a top plan layout view illustrating an exemplary embodiment of a liquid crystal display ("LCD") device having the display substrate of FIG. 1.
Figure 5:
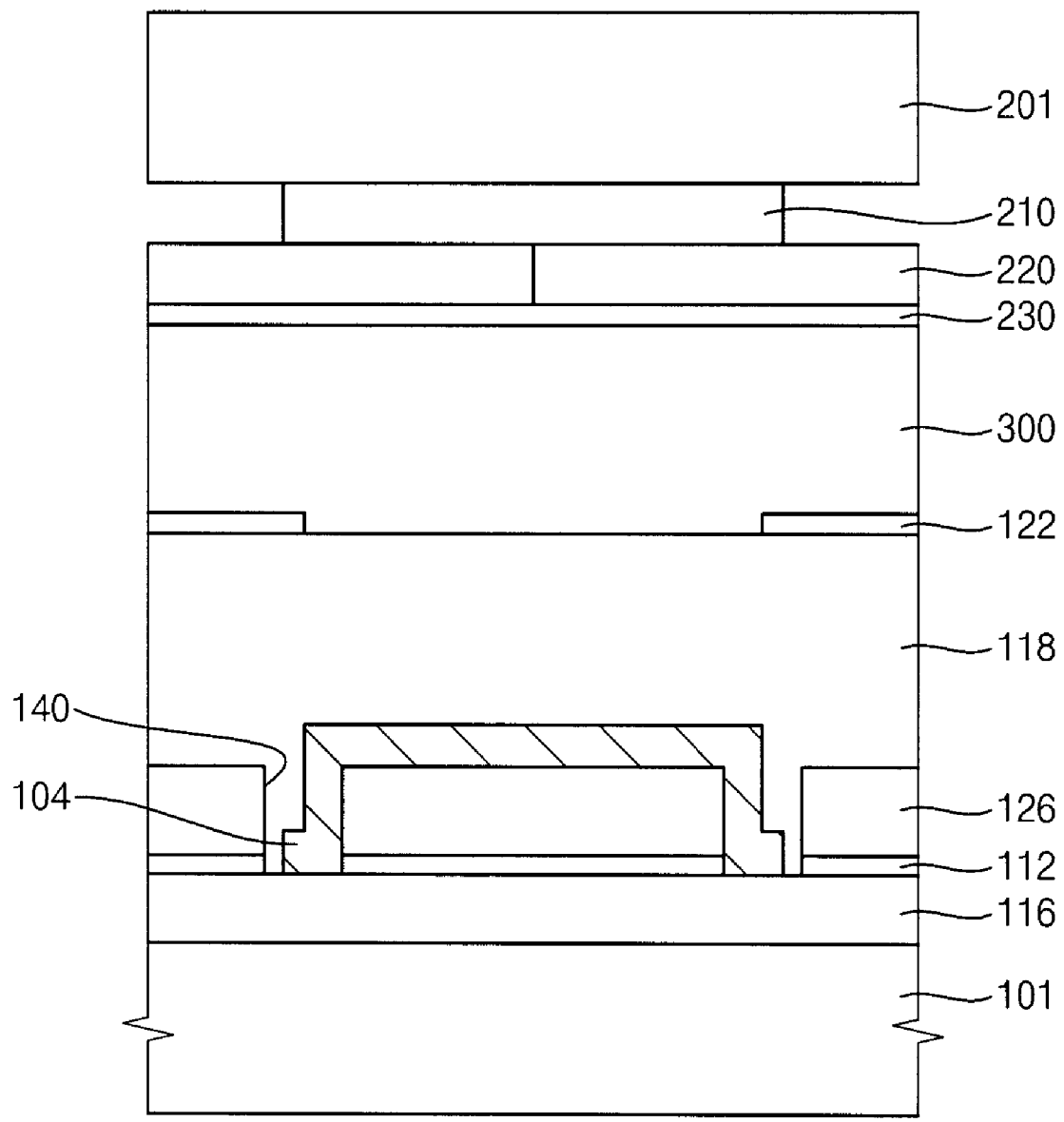
FIG. 5 is a cross-sectional view taken along line III-III' of FIG. 4.

FIG. 4 is a top plan layout view illustrating a liquid crystal display ("LCD") device having the exemplary embodiment of a display substrate of FIG. 1. FIG. 5 is a cross-sectional view taken along line III-III' of FIG. 4.

The display substrate of the present exemplary embodiment is substantially the same as in FIGS. 1 to 3. Thus, the same reference numerals will be used to refer to the same or similar parts as those described in FIGS. 1 to 3 and any further explanation concerning the above elements will be omitted.

Referring to FIGS. 3 and 4, the exemplary embodiment of an LCD device includes an upper substrate 201, a lower substrate 101 and a liquid crystal layer 300 interposed between the upper substrate 201 and the lower substrate 101. In the present exemplary embodiment, the upper substrate 201 includes a black matrix 210, a color filter 220 and a common electrode 230.

The black matrix 210 includes a light-blocking material which divides the light generated from the backlight assembly according to a plurality of pixel areas. Exemplary embodiments of the black matrix 210 may include a metallic layer, exemplary embodiments of which include a chromium (Cr) layer, or an organic layer including a photoresist.

Exemplary embodiments of the color filter 220 may include an organic layer having a colorant. In one exemplary embodiment, the color filter 220 may be formed through a photo process including an exposure step and a development step. In FIGS. 4 and 5, the color filter 220 is formed on the upper substrate 201. Alternative exemplary embodiments include configurations wherein the color filter may be formed on the TFT of the lower substrate 101 or under the TFT of the lower substrate 101.

Exemplary embodiments include configurations wherein the common electrode 230 includes a transparent conductive layer, and wherein the common electrode 230 is formed on substantially the entire surface of the upper substrate 201 having the color filter 220. In one exemplary embodiment, a planarization layer (not shown) may be interposed between the common electrode 230 and the color filter 220.

The black matrix 210 of the upper substrate 201 corresponds to the opening part 140 of the lower substrate 101. In one exemplary embodiment, the width of the data line 104 formed in the opening part 140 of the lower substrate 101 may be substantially the same as the width of the black matrix 210 of the upper substrate 201, or may be greater than the width of the black matrix 210 by up to about 20%. In the exemplary embodiment wherein the width of the data line 104 is greater than that of the black matrix 210, the leakage of the light may be prevented even though the upper substrate 201 is misaligned with the lower substrate 101.

In one exemplary embodiment, the opening part 140 of the lower substrate 101 may be formed only in a boundary between the data line 104 and the pixel electrode 122, and the insulating interlayer 126 and the gate insulating layer 112 may remain along a side of the pixel region, which is spaced apart from the data line 104. A portion of the data line 104 formed on the insulating interlayer 126 is formed along the side surfaces of the insulating interlayer 126 and the gate insulating layer 112, which form the side surface of the opening part 140, so that the data line 104 has the stepped structure on the side surface of the opening part 140.

The data line 104 of the lower substrate 101 may be partially overlapped by the pixel electrode 122. Even though the data line 104 is partially overlapped by the pixel electrode 122, a distance between the data line 104 formed in the opening part 140 and the pixel electrode 122 is increased by the opening part 140 so that the parasitic capacitance and the leakage of the light may be minimized.

In one exemplary embodiment, the protective layer 118 of the lower substrate 101 may include an organic layer having a low dielectric constant. Alternative exemplary embodiments include configurations wherein the protective layer 118 may have a multilayer structure having inorganic layers such as an oxide layer, a nitride layer, and various other materials with similar characteristics.

FIGS. 6, 8, 11, 13 and 15 are cross-sectional views illustrating an exemplary embodiment of a method of manufacturing the exemplary embodiment of an LCD device of FIG. 4. FIGS. 7, 9, 10, 12, 14 and 16 are top plan layout views illustrating an exemplary embodiment of a method of manufacturing the exemplary embodiment of an LCD device of FIG. 4.

Figure 6:
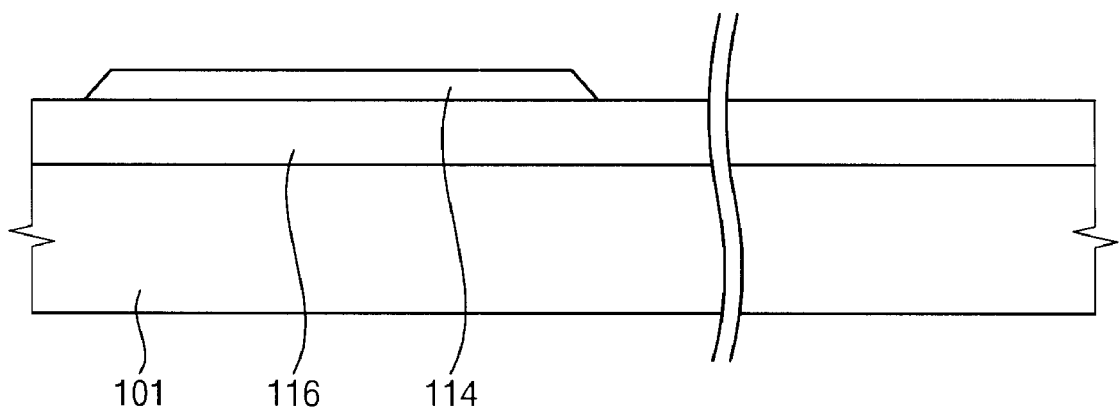
FIGS. 6, 8, 11, 13 and 15 are cross-sectional views illustrating an exemplary embodiment of a method of manufacturing the exemplary embodiment of an LCD device of FIG. 4.
Figure 7:
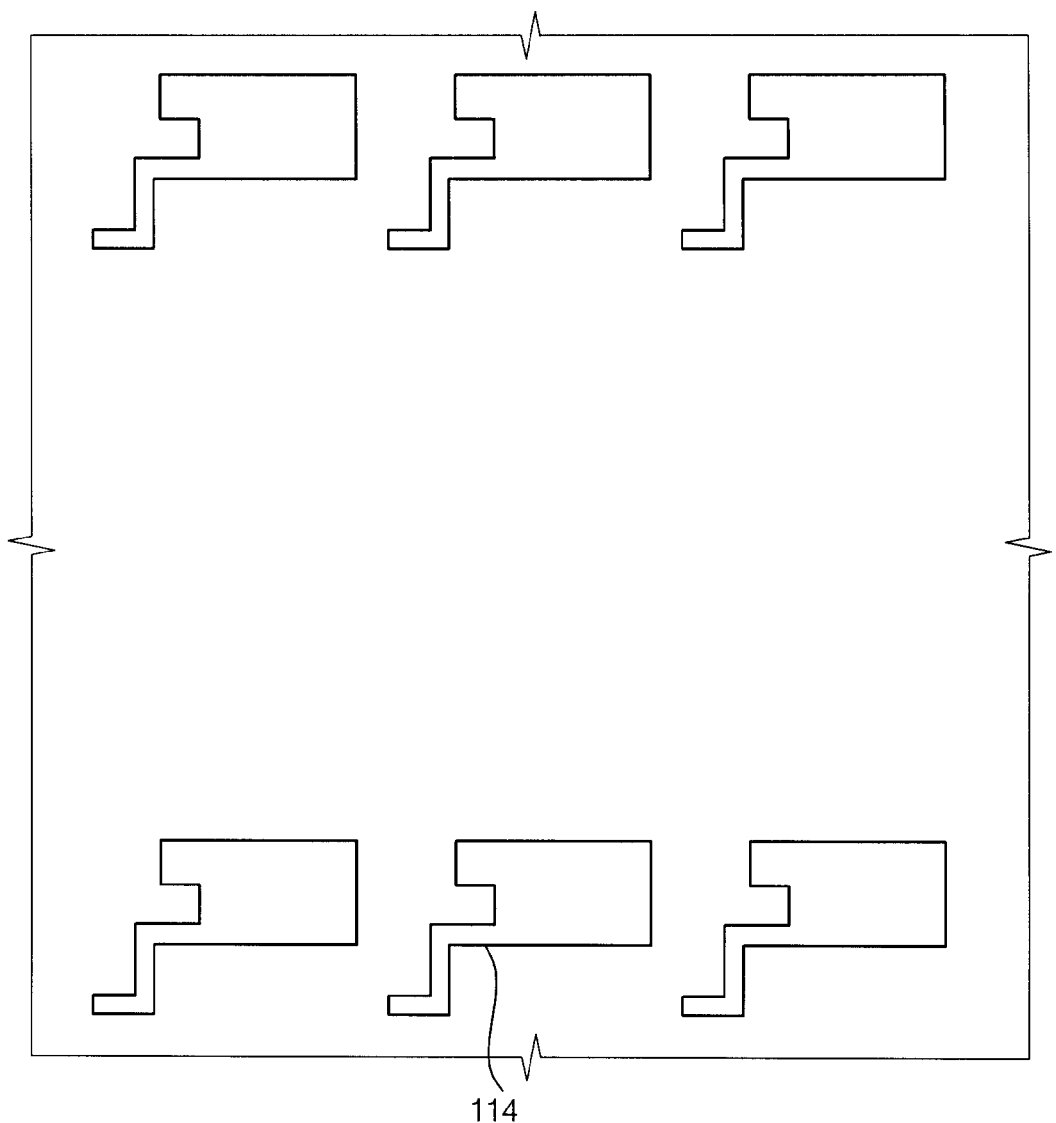
FIGS. 7, 9, 10, 12, 14 and 16 are top plan layout views illustrating an exemplary embodiment of a method of manufacturing the exemplary embodiment of an LCD device of FIG. 4.

FIG. 6 is a cross-sectional view illustrating forming a blocking layer 116 and an active layer 114 on an insulating substrate 101. FIG. 7 is a top plan layout view illustrating forming the blocking layer 116 and the active layer 114 on the insulating substrate 101 shown in FIG. 6.

Referring to FIGS. 6 and 7, the blocking layer 116 and an amorphous silicon layer are formed on the substrate 101, in sequence. The amorphous silicon layer is crystallized to form a polysilicon layer. The polysilicon layer may be formed through a laser crystallizing method, a solid phase crystallization method, and various other techniques as would be known to one of ordinary skill in the art. The laser crystallizing method includes an excimer laser annealing method, a sequential lateral solidification method, and other similar methods. The solid phase crystallization may be performed using a furnace or a rapid thermal annealing. A photoresist organic layer is coated on the polysilicon layer. The photoresist organic layer is exposed through a mask and is developed to form a photoresist organic pattern. The polysilicon layer is etched using the photoresist organic pattern to form the active layer 114. The active layer 114 may be implanted by group 3 elements such as boron to control a threshold voltage of the active layer 114.

Figure 8:
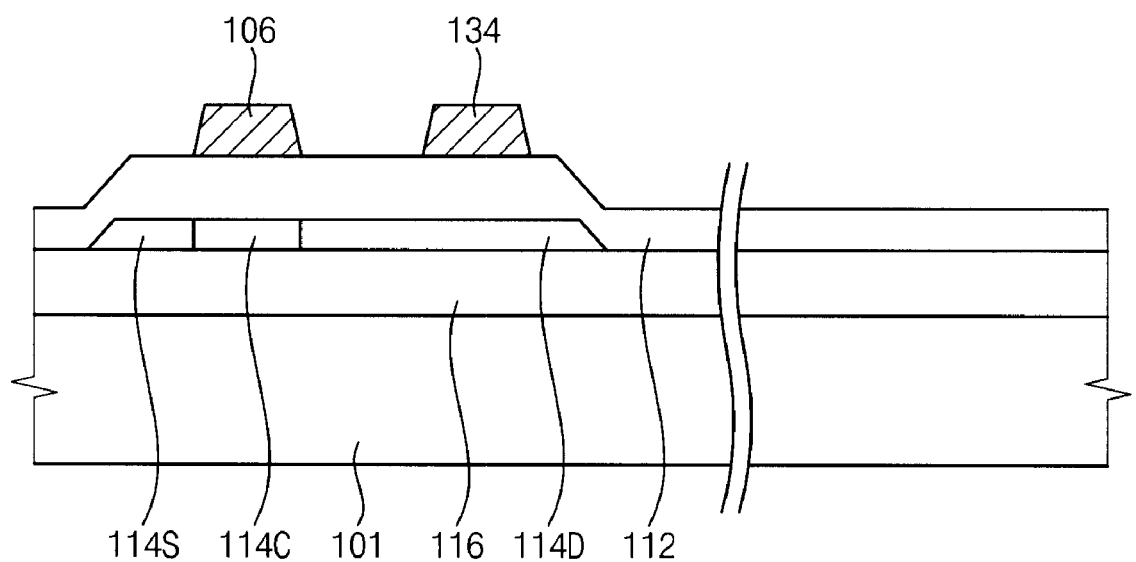
Figure 9:
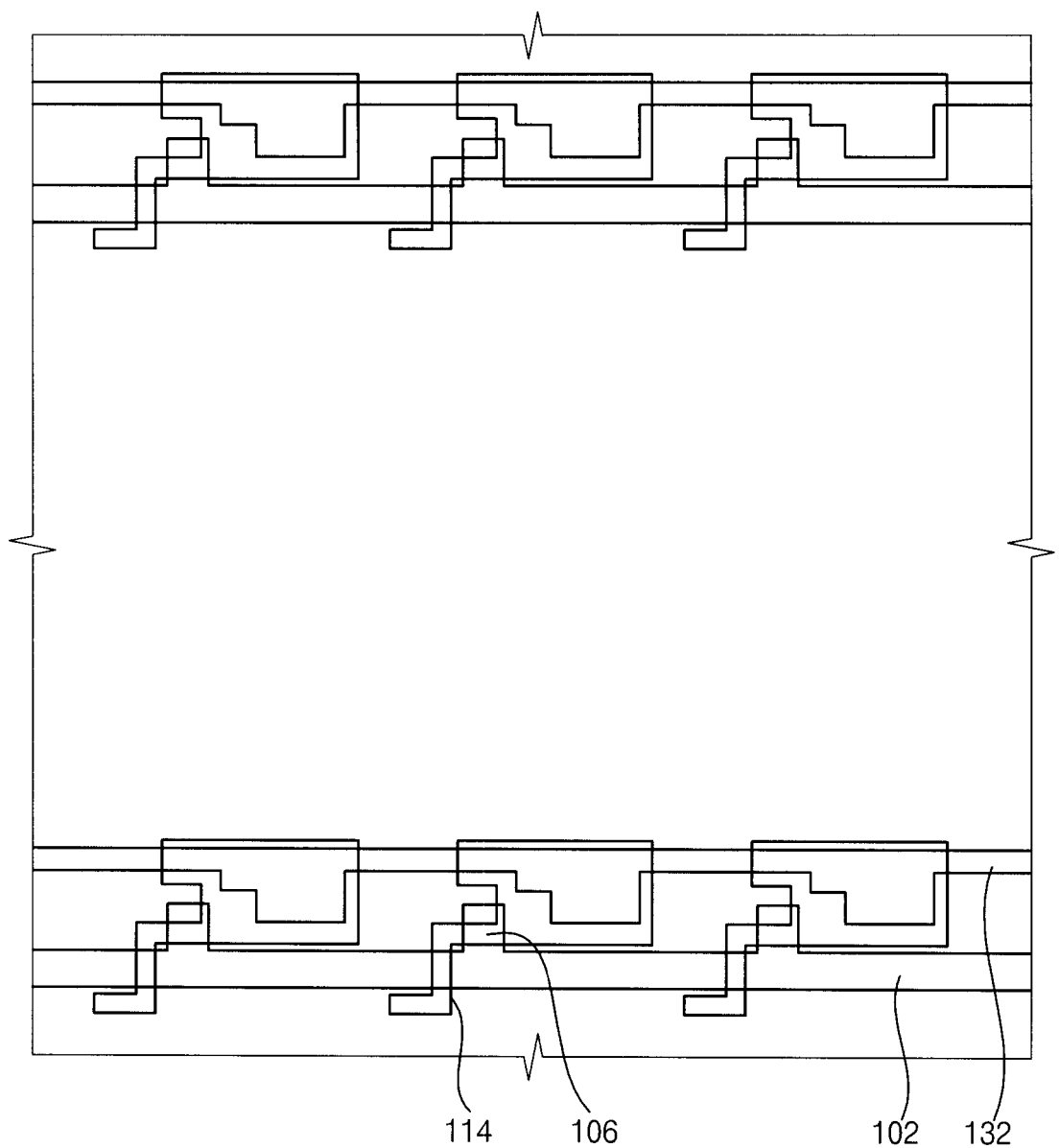

FIG. 8 is a cross-sectional view illustrating forming a gate insulating layer 112 and a gate pattern, including the gate line 102, the gate electrode 106, the storage line 132 and a lower storage electrode 134 on the substrate shown in FIG. 6. FIG. 9 is a top plan layout view illustrating forming the gate insulating layer 112 and the gate pattern shown in FIG. 8.

Referring to FIGS. 8 and 9, the gate insulating layer 112 and a first conductive layer are formed on the active layer 114. A photoresist organic layer is coated on the first conductive layer, and is exposed through a mask. The exposed photoresist organic layer is developed to form a photoresist organic pattern. The first conductive layer is etched through the photoresist organic pattern to form the gate electrode 106 and the gate line 102.

In one exemplary embodiment, Group 15 elements such as phosphorous are implanted into the active layer 114 using the gate electrode 106 as a mask to define the source region 114S and the drain region 114D. In one exemplary embodiment, the drain region 114D may be extended to a storage region so that the drain region may be disposed under the lower storage electrode 134. A remainder of the active layer 114, which is blocked by the gate electrode 106 is defined as the channel region 114C.

Figure 10:
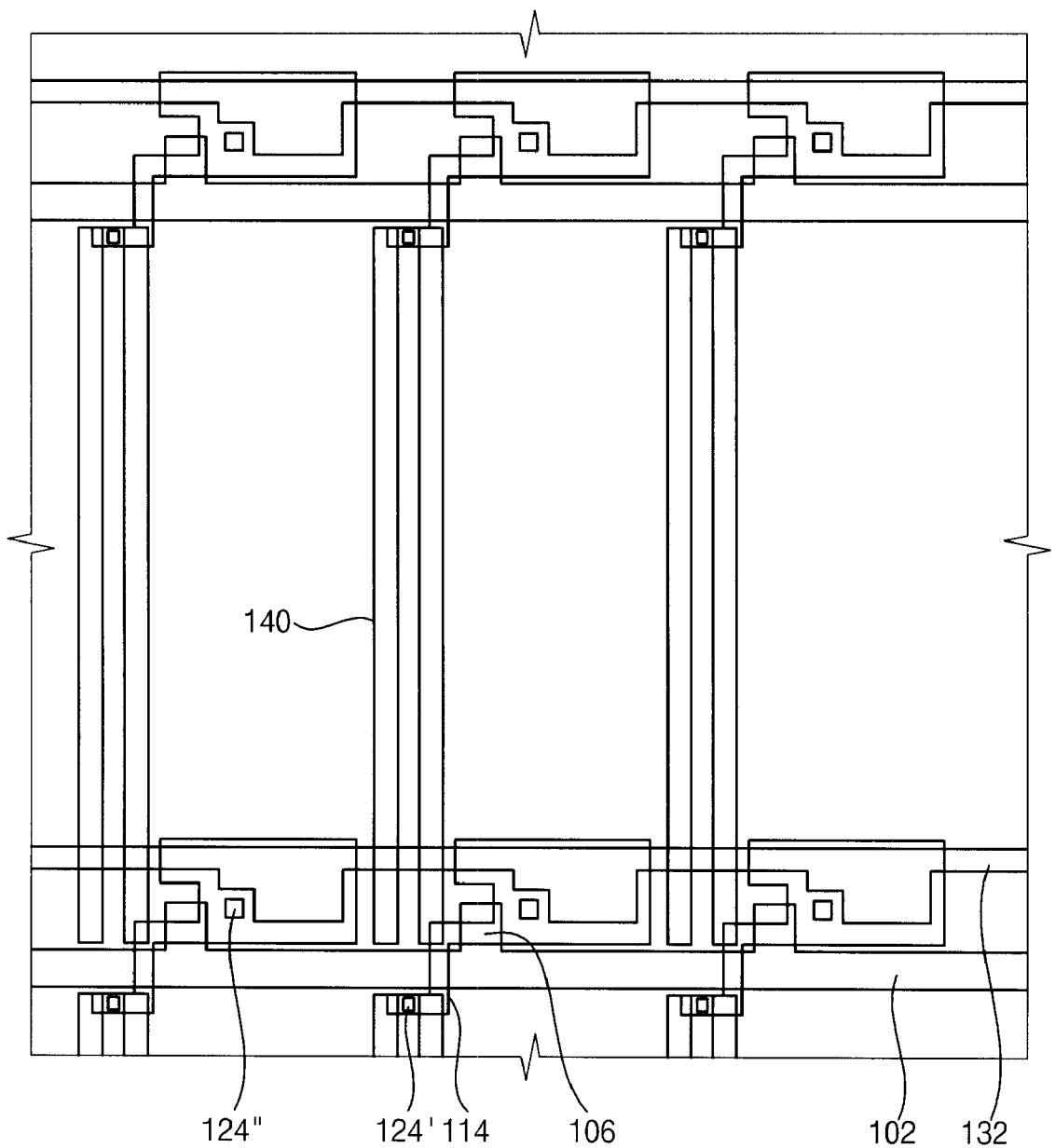

FIG. 10 is a top plan layout view illustrating forming an insulating interlayer 126 and an opening part 140 on the substrate shown in FIG. 9.

Referring to FIGS. 2 and 10, the insulating interlayer 126 is formed on the substrate having the gate electrode 106. A photoresist organic layer is coated on the insulating interlayer 126, and is exposed through a mask. The exposed photoresist organic layer is developed to form the contact holes 124S and 124D, through which the source region 114S and the drain region 114D are exposed. Also, the insulating interlayer 126 and the gate insulating layer 112 corresponding to a region adjacent to the data line 104 are etched to form the opening part 140. In one exemplary embodiment, the insulating interlayer 126 may include a single inorganic layer such as an oxide layer, a nitride layer, and various other materials having similar characteristics. Alternative exemplary embodiments include configurations wherein the insulating interlayer 126 may include a multilayer structure having a plurality of layers. In one exemplary embodiment, the insulating interlayer 126 may include a plurality of hydrogen atoms so that dangling bonds in the channel layer may be decreased.

Figure 11:
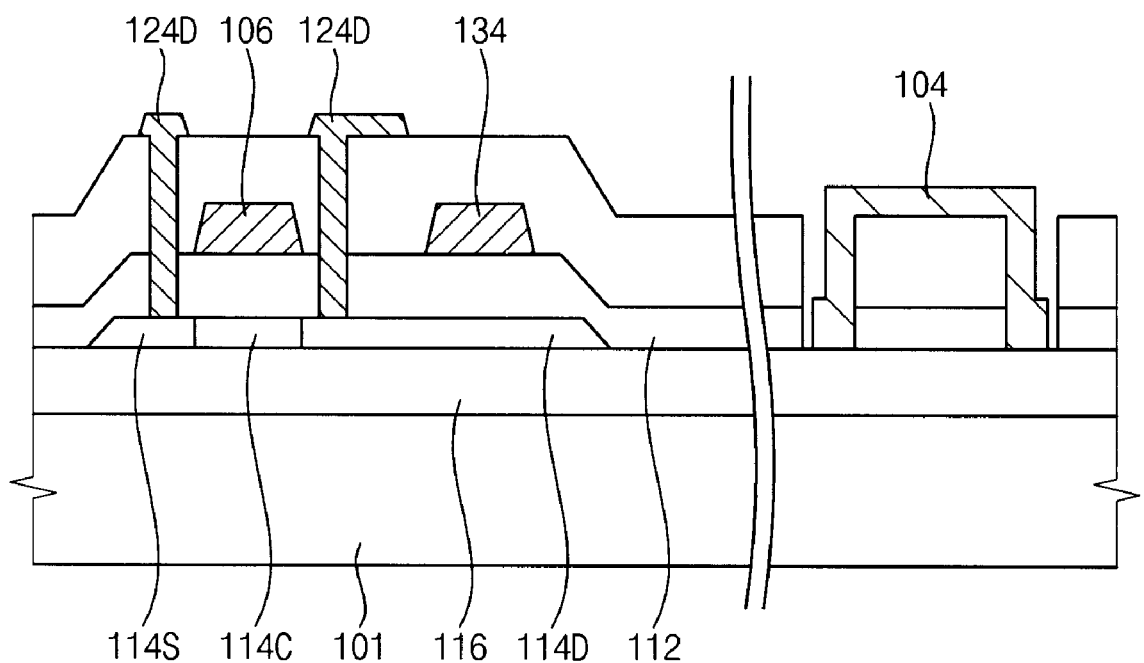
Figure 12:
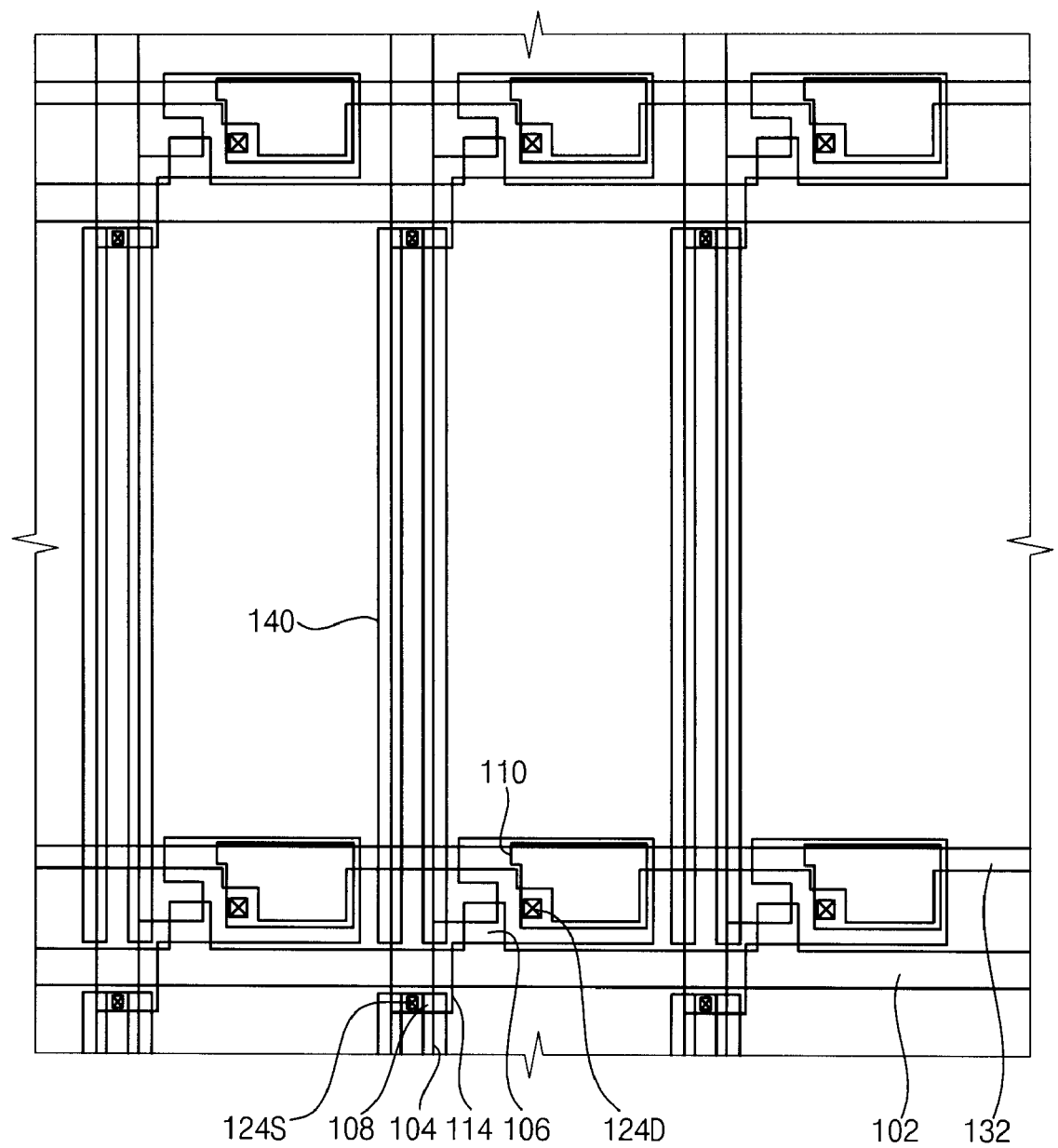

FIG. 11 is a cross-sectional view illustrating forming a data pattern including a data line 104, a source electrode 108 and a drain electrode 110, on the substrate shown in FIG. 10. FIG. 12 is a cross-sectional view illustrating forming the data pattern on the substrate shown in FIG. 10.

Referring to FIGS. 11 and 12, a second conductive layer is formed on the insulating interlayer 126, and the second conductive layer is patterned through a photolithography process to form the source electrode 108 making contact with the source region 114S, the drain electrode 110 making contact with the drain region 114D and the data line 104 along the opening part 140. The width of the opening part 140 corresponding to the data line 104 may be greater than the width of the data line 104. The opening part 140 may be formed by partially etching the insulating interlayer 126 and the gate insulating layer 112 adjacent to the side of the pixel electrode 124. In the present exemplary embodiment, the data line 104 has the stepped structure along the side surface of the opening part 140.

Figure 13:
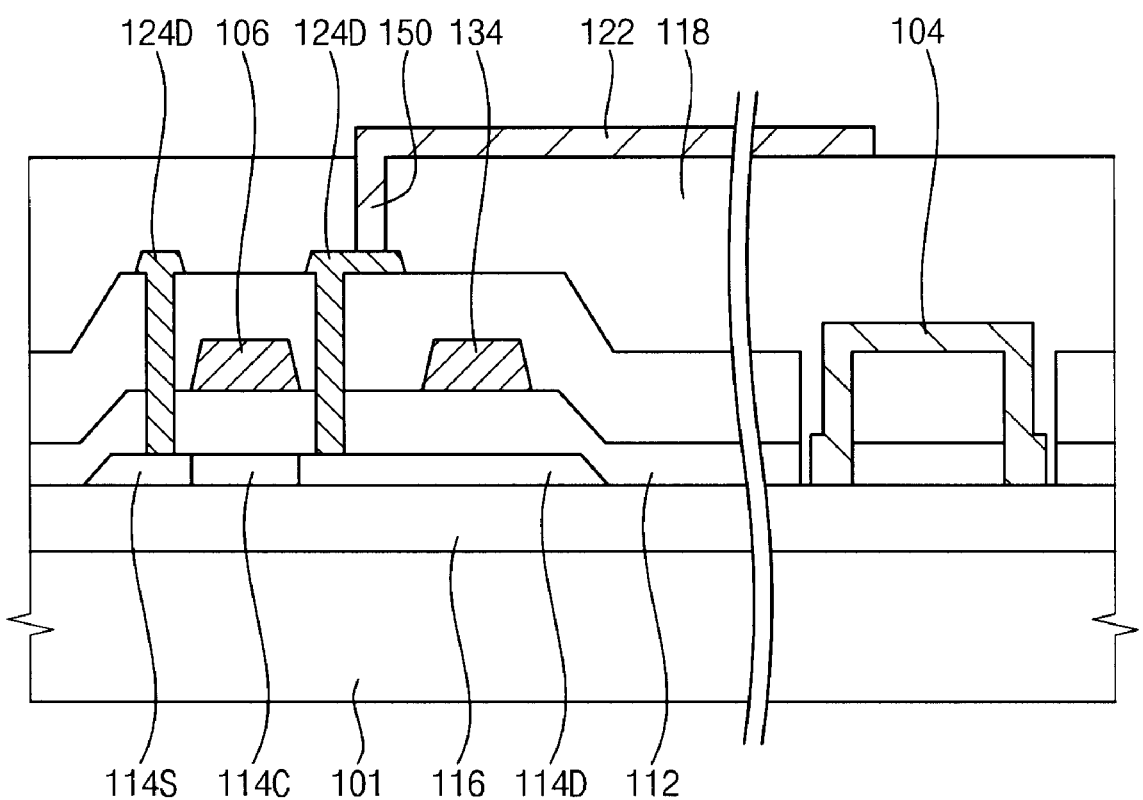
Figure 14:
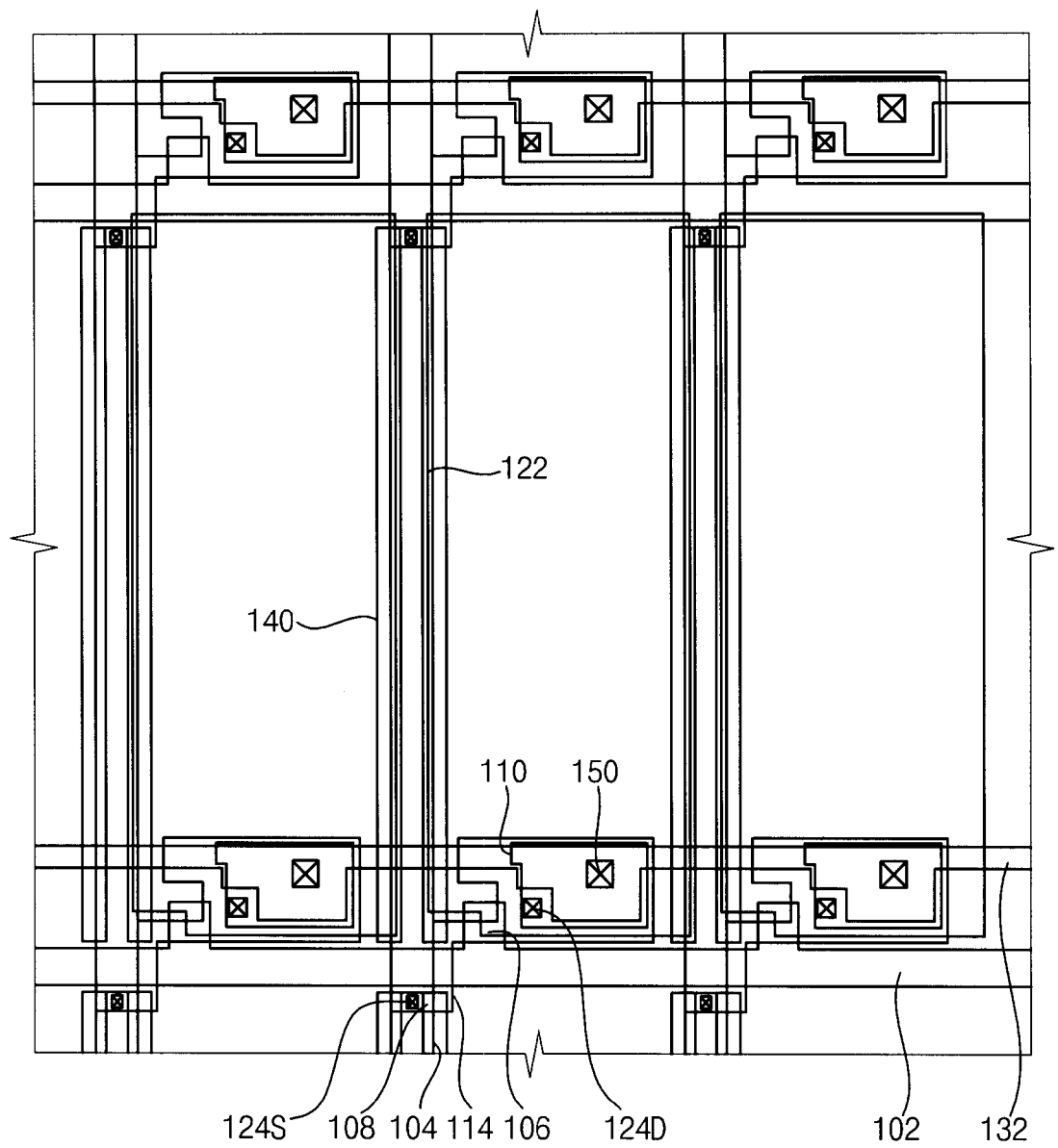

FIG. 13 is a cross-sectional view illustrating forming a protective layer 118 and a pixel electrode 122 on the substrate shown in FIG. 11. FIG. 14 is a top plan layout view illustrating forming the protective layer 118 and the pixel electrode 122 on the lower substrate shown in FIG. 12.

Referring to FIGS. 13 and 14, the protective layer 118 is formed on the substrate having the source electrode 108, the drain electrode 110 and the data line 104. A transparent conductive layer is formed on the protective layer 118. A photoresist organic layer is coated on the transparent conductive layer, and is exposed through a mask. The exposed photoresist organic layer is developed to form a photoresist organic pattern. The transparent conductive layer is etched using the photoresist organic pattern as an etching mask to form the pixel electrode 122. In one exemplary embodiment, the protective layer 118 may include an organic layer so that the parasitic capacitance between the pixel electrode 122 and the data line 104 may be further minimized.

Figure 15:
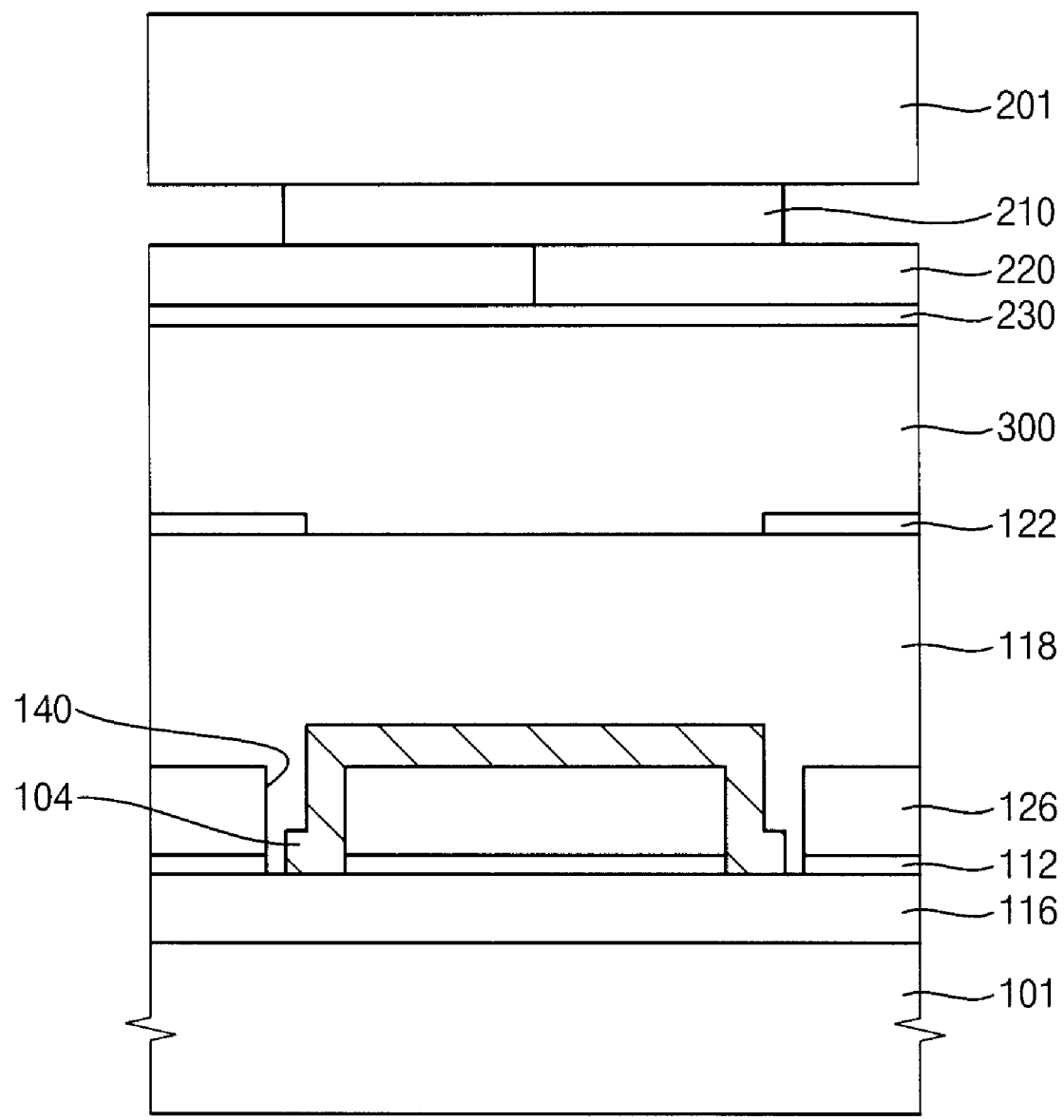
Figure 16:
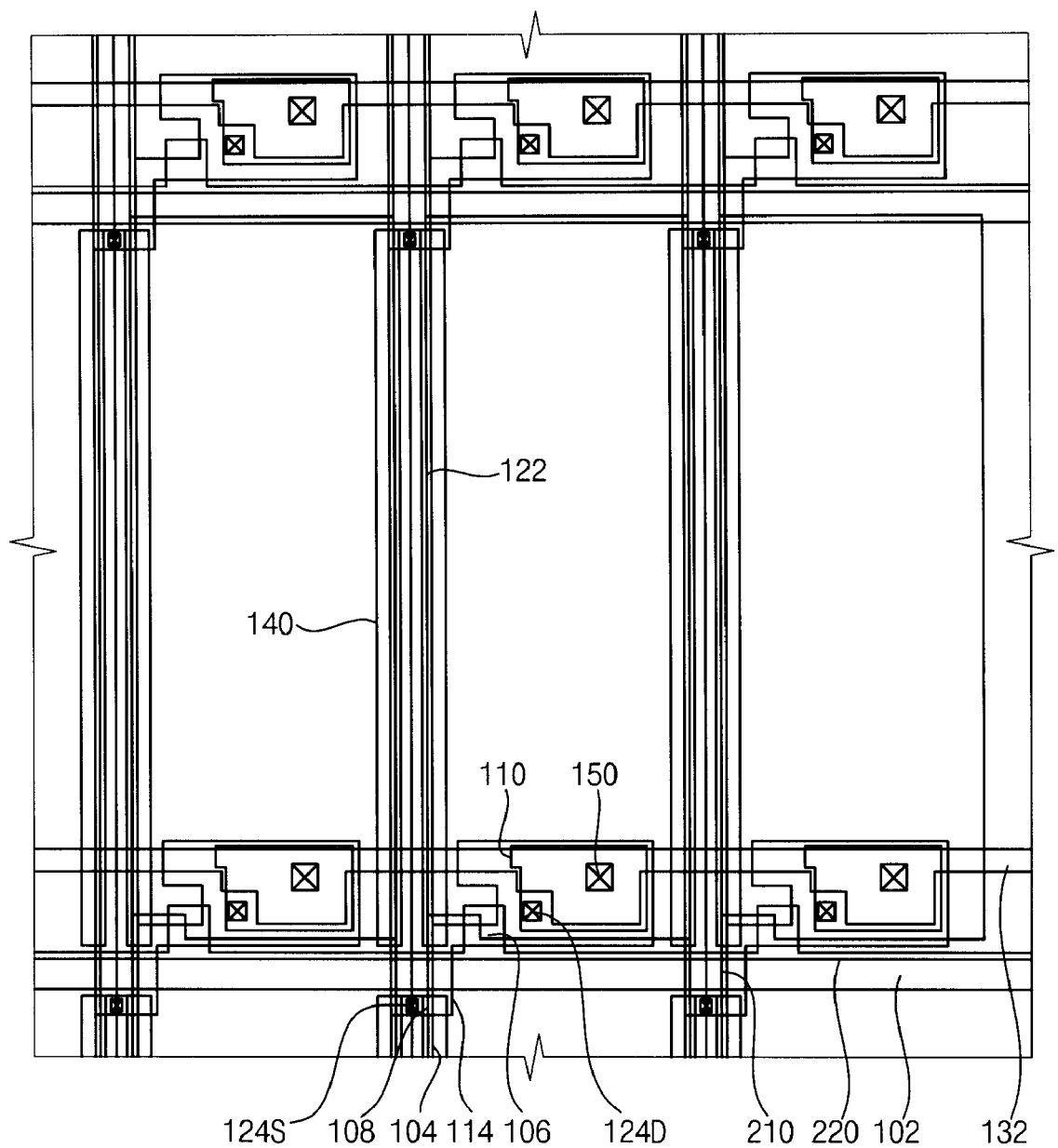

FIG. 15 is a cross-sectional view illustrating combining an upper substrate 201 on the substrate shown in FIG. 13 and interposing a liquid crystal layer 300 between the substrates. FIG. 16 is a top plan layout view illustrating combining the upper substrate 201 on the substrate shown in FIG. 13 and interposing the liquid crystal layer 300 between the substrates.

Referring to FIGS. 15 and 16, the upper substrate 201, which includes the black matrix 210, the color filter 220 and the common electrode 230, is combined with the lower substrate 101, and the liquid crystal layer 300 is interposed between the upper substrate 201 and the lower substrate 101. In an alternative exemplary embodiment, the liquid crystal layer 300 is dropped on the lower substrate 101 and the upper substrate 201 may be combined with the lower substrate 101.

According to another exemplary embodiment of the present invention, a black matrix is omitted, and an opening of a pixel region is formed only by the data lines. Thus, a parasitic capacitance between the pixel electrode and the data lines may be minimized, and leakage of light may be decreased. Also, an aperture ratio may be increased.

The foregoing is illustrative of the present invention and is not to be construed as limiting thereof. Although a few exemplary embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A display substrate comprising:
    a gate line disposed on a substrate;
    a first insulating layer disposed on the substrate including the gate line, the first insulating layer including an opening part extended in a direction crossing the gate line;
    a data line disposed on the first insulating layer and an inner surface of the opening part, the data line extending in a direction substantially parallel with an extension direction of the opening part, and the data line has a stepped structure in a direction away from the substrate;
    a protective layer disposed on the first insulating layer and the data line;
    a switching element electrically connected to the gate line and the data line; and
    a pixel electrode electrically connected to the switching element,
    wherein the opening part is overlapped with a gap between adjacent pixel electrodes.

2. The display substrate of claim 1, wherein opposing side edges defining a width of the data line are separated from outbound side edges defining the opening part.

3. The display substrate of claim 2, wherein the stepped structure is disposed on the opening part.

4. The display substrate of claim 3, wherein the pixel electrode overlaps the opening part.

5. The display substrate of claim 4, wherein the protective layer comprises an organic insulating layer.

6. The display substrate of claim 4, wherein the pixel electrode overlaps the data line.

7. The display substrate of claim 2, further comprising a second insulating layer interposed between the substrate and the first insulating layer.

8. The display substrate of claim 7, wherein a side surface of the opening part is formed through the first and second insulating layers.

9. The display substrate of claim 8, wherein the second insulating layer comprises a gate insulating layer.

10. The display substrate of claim 7, wherein the data line contacts the substrate, the first insulating layer and the second insulating layer in the opening part.

11. The display substrate of claim 7, further comprising a blocking layer interposed between the substrate and the second insulating layer.

12. A liquid crystal display device comprising:
a first display substrate including a first substrate, a black matrix disposed on the first substrate and a common electrode disposed on the first substrate including the black matrix;
a second display substrate comprising:
   a gate line disposed on a second substrate;
   a first insulating layer disposed on the second substrate including the gate line, the first insulating layer including an opening part extended in a direction crossing the gate line;
   a data line disposed on the first insulating layer and an inner surface of the opening part, the data line extending in a direction substantially parallel with an extension direction of the opening part, and the data line has a stepped structure in a direction away from the substrate;
   a protective layer disposed on the first insulating layer and the data line;
   a switching element electrically connected to the gate line and the data line; and
   a pixel electrode electrically connected to the switching element; and
a liquid crystal layer interposed between the first and second display substrates,
wherein the opening part is overlapped with a gap between adjacent pixel electrodes.

13. The liquid crystal display device of claim 12, wherein the black matrix corresponds to the opening part.

14. The liquid crystal display device of claim 13, wherein opposing side edges defining a width of the data line disposed in the opening part are separated from outbound side edges defining the opening part.

15. The liquid crystal display device of claim 14, further comprising a second insulating layer interposed between the second substrate and the first insulating layer.

16. The liquid crystal display device of claim 14, wherein the pixel electrode overlaps the data line.

17. The liquid crystal display device of claim 16, wherein a width of the data line disposed in the opening part is one of substantially the same as a width of the black matrix and greater than the width of the black matrix by up to about 20%.

18. The liquid crystal display device of claim 16, wherein the protective layer comprises an organic insulating layer.

* * * * *